United States Patent
van der Straten et al.

(10) Patent No.: US 12,040,230 B2
(45) Date of Patent: Jul. 16, 2024

(54) ENCAPSULATED TOP VIA INTERCONNECTS

(71) Applicant: INTERNATIONAL BUSINESS MACHINES CORPORATION, Armonk, NY (US)

(72) Inventors: Oscar van der Straten, Guilderland Center, NY (US); Kenneth C. K. Cheng, Shatin (HK); Joseph F. Maniscalco, Greenville, SC (US); Koichi Motoyama, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 24 days.

(21) Appl. No.: 17/499,518

(22) Filed: Oct. 12, 2021

(65) Prior Publication Data
US 2022/0044967 A1     Feb. 10, 2022

Related U.S. Application Data

(62) Division of application No. 16/589,529, filed on Oct. 1, 2019, now Pat. No. 11,177,171.

(51) Int. Cl.
| | |
|---|---|
| *H01L 21/76* | (2006.01) |
| *H01L 21/02* | (2006.01) |
| *H01L 21/768* | (2006.01) |
| *H01L 23/522* | (2006.01) |
| *H01L 23/532* | (2006.01) |

(52) U.S. Cl.
CPC .. *H01L 21/76888* (2013.01); *H01L 21/02244* (2013.01); *H01L 21/02247* (2013.01); *H01L 21/76885* (2013.01); *H01L 23/5226* (2013.01); *H01L 23/53252* (2013.01)

(58) Field of Classification Search
CPC ......... H01L 21/76888; H01L 21/02244; H01L 21/02247; H01L 21/76885; H01L 23/5226; H01L 23/53252; H01L 21/76897; H01L 21/76852
See application file for complete search history.

(56) References Cited

U.S. PATENT DOCUMENTS

| | | | |
|---|---|---|---|
| 4,536,951 A | 8/1985 | Rhodes et al. | |
| 4,614,021 A * | 9/1986 | Hulseweh | H01L 21/76885 438/626 |
| 5,496,771 A * | 3/1996 | Cronin | H01L 29/4933 257/E21.575 |
| 5,510,651 A | 4/1996 | Maniar et al. | |

(Continued)

OTHER PUBLICATIONS

List of IBM Patents or Patent Applications Treated as Related dated Oct. 12, 2021 2 pages.

*Primary Examiner* — Mohammed Shamsuzzaman
(74) *Attorney, Agent, or Firm* — Tutunjian & Bitetto, P.C.; Robert Richard Aragona

(57) ABSTRACT

Integrated chips and methods of forming the same include forming a lower conductive line over an underlying layer. An upper conductive via is formed over the lower conducting lines. An encapsulating layer is formed on the lower conductive line and the upper conductive via using a treatment process that converts an outermost layer of the lower conductive line and the upper conductive via into the encapsulating layer.

12 Claims, 6 Drawing Sheets

(56) References Cited

U.S. PATENT DOCUMENTS

| | | | |
|---|---|---|---|
| 5,693,568 A * | 12/1997 | Liu | H01L 21/76897 438/618 |
| 6,140,238 A * | 10/2000 | Kitch | H01L 21/76897 438/653 |
| 6,444,565 B1 | 9/2002 | Feild et al. | |
| 6,620,723 B1 * | 9/2003 | Byun | C23C 16/45531 257/E21.171 |
| 6,737,313 B1 | 5/2004 | Marsh et al. | |
| 6,867,073 B1 * | 3/2005 | Enquist | H01L 21/76898 438/455 |
| 7,012,312 B2 | 3/2006 | Iwasaki et al. | |
| 7,595,263 B2 * | 9/2009 | Chung | C23C 16/02 257/E21.171 |
| 7,713,876 B2 | 5/2010 | Suzuki | |
| 8,492,270 B2 * | 7/2013 | Ponoth | H01L 21/76885 257/E21.575 |
| 8,586,473 B1 | 11/2013 | Tanwar et al. | |
| 9,281,263 B2 * | 3/2016 | Lee | H01L 21/76867 |
| 9,613,861 B2 | 4/2017 | Anderson et al. | |
| 9,761,489 B2 * | 9/2017 | Mebarki | H01L 21/76885 |
| 9,837,603 B1 * | 12/2017 | Deshpande | H10N 50/01 |
| 9,859,215 B1 | 1/2018 | Edelstein et al. | |
| 10,461,251 B2 * | 10/2019 | Aggarwal | H10B 61/22 |
| 2002/0155693 A1 | 10/2002 | Hong et al. | |
| 2005/0018016 A1 * | 1/2005 | Silverbrook | G06F 21/86 347/54 |
| 2006/0202346 A1 * | 9/2006 | Shih | H01L 23/53238 257/774 |
| 2009/0232969 A1 * | 9/2009 | Hayton | H01L 21/288 427/58 |
| 2012/0273958 A1 * | 11/2012 | Kim | H01L 23/5226 257/774 |
| 2014/0035142 A1 * | 2/2014 | Yang | H01L 23/53295 438/653 |
| 2015/0056800 A1 * | 2/2015 | Mebarki | H01L 21/32139 438/666 |
| 2015/0097284 A1 * | 4/2015 | Uzoh | H01L 21/76885 257/737 |
| 2015/0102006 A1 * | 4/2015 | Mudivarthi | H10B 61/00 216/11 |
| 2016/0307793 A1 * | 10/2016 | Huang | H01L 23/53209 |
| 2018/0097177 A1 * | 4/2018 | Chang | H10N 70/24 |
| 2019/0214558 A1 * | 7/2019 | Ando | G11C 13/003 |
| 2020/0243602 A1 * | 7/2020 | Jiang | H01L 28/60 |

* cited by examiner

ENCAPSULATED TOP VIA INTERCONNECTS

BACKGROUND

The present invention generally relates to integrated chip fabrication and, more particularly, to fabricating interconnects and vias with alternative conductor materials.

For reliable dual-damascene interconnects that have critical dimensions smaller than 15 nm, void-free metal fills and good dimensional control are important. Using copper as a main conductor for these interconnects poses several challenges. Voids are common in lines and vias, such as sidewall voids, due to poor copper coverage. Due to the restricted geometry in damascene features, only small copper grains are present. Further, copper diffusion barriers start to make up a proportionally larger part of the via and line resistances.

SUMMARY

A method for fabricating an integrated hip includes forming a lower conductive line over an underlying layer. An upper conductive via is formed over the lower conducting lines. An encapsulating layer is formed on the lower conductive line and the upper conductive via using a treatment process that converts an outermost layer of the lower conductive line and the upper conductive via into the encapsulating layer.

An integrated chip includes a lower conductive line. An etch stop layer is formed from a first conductive material on the lower conductive line. An upper conductive via is formed from a second conductive material, that is selectively etchable with respect to the first conductive material, over the etch stop layer. An interlayer dielectric is formed around the lower conductive line, the upper conductive via, and the etch stop layer. An encapsulation layer is formed on outer surfaces of the upper conductive via and promotes adhesion between the lower conductive line, the upper conductive via and the interlayer dielectric.

An integrated chip includes a lower conductive line, formed from a first conductive material. An upper conductive via is formed from a second conductive material, that is selectively etchable with respect to the first conductive material, over the lower conductive via. An interlayer dielectric is formed around the lower conductive line and the upper conductive via. An encapsulation layer is formed on outer surfaces of the upper conductive via that promotes adhesion between the lower conductive line, the upper conductive via and the interlayer dielectric.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide interconnects that use alternative conductive materials, such as ruthenium and iridium to form interconnects at small critical dimensions (e.g., less than about 15 nm). One challenge that the present embodiments overcome is that it is difficult to control the dimensions (e.g., relative heights between vias and lines) of structures when only a single conductive material is used.

To address this, the present embodiments use two different conductive materials. In some embodiments, a first material is used for both the vias and the lines, with a second material being used in between as an etch stop. In other embodiments, a first material is used for the lines and a second material is used for the vias. This makes it possible to precisely control the relative heights of these structures.

The present embodiments further address problems that arise from poor adhesion between the conductive material and a surrounding dielectric. For example, voids can form between sidewalls and the adjacent interlayer dielectric when there is poor adhesion. Furthermore, a planarization process can cause via rupture if the dielectric is not providing proper support. The present embodiments address this problem by forming an encapsulating layer on and around the vias and lines. The encapsulating layer has superior adhesion to the dielectric material and, thus, helps protect against voids and damage. In addition, the process of forming the encapsulation layer has good control over the thickness of the layer, producing a self-aligned, conformal layer.

Figure 1:
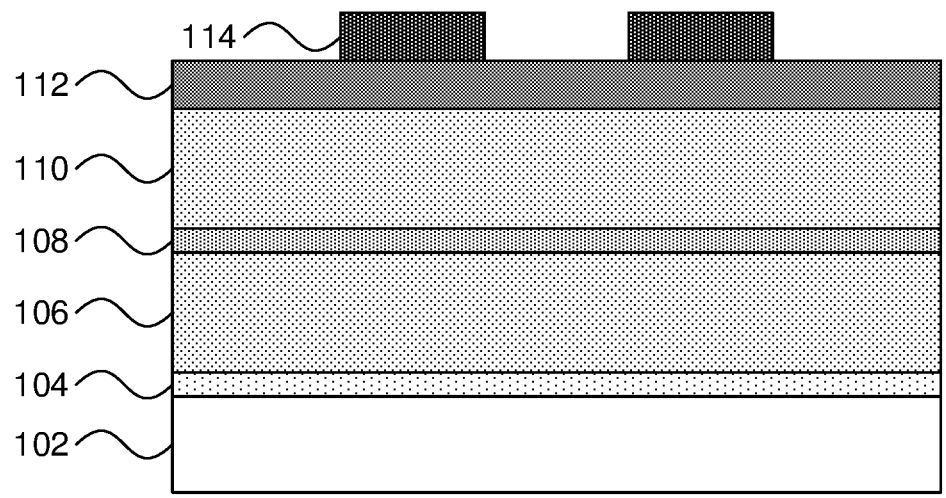
FIG. 1 is a cross-sectional view of a step in the fabrication of vias on a conductive line with an encapsulating layer that shows the formation of a stack of conductive layers in accordance with an embodiment of the present invention.

Referring now to the drawings in which like numerals represent the same or similar elements and initially to FIG. 1, a cross-sectional view of a step in the fabrication of conductive lines and vias in an integrated chip is shown. A seed layer 104 is formed on an underlying layer 102. The underlying layer 102 can be formed from any appropriate material, such as semiconductor material or an interlayer dielectric, and can include active or passive devices within it, such as transistors, capacitors, transmission lines, and any other appropriate structure. In some embodiments, the seed layer 104 can be formed with a thickness between about 0.5 nm and about 50 nm.

The seed layer 104 provides a nucleation site for the formation of a lower conductive layer 106. In some embodiments, the lower conductive layer can be formed with a thickness between about 5 nm and about 200 nm. In some embodiments, the seed layer 104 can be formed from tantalum nitride and the lower conductive layer 106 can be formed from ruthenium, but it should be understood that any appropriately matched materials can be used. For example, alternative materials for the conductive layer 106 can include platinum, palladium, osmium, and rhodium.

In some embodiments, the seed layer 104 can be omitted and the lower conductive layer 106 can be formed directly on the underlying layer. Furthermore, any appropriate deposition process can be used to deposit the seed layer 104 and the lower conductive layer 106, such as, e.g., chemical vapor deposition (CVD), physical vapor deposition (PVD), atomic layer deposition (ALD), gas cluster ion beam (GCIB) deposition, or electroplating.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

In some embodiments, an etch stop layer 108 is formed on the lower conductive layer 106. In some embodiments, the etch stop layer 108 can be formed from iridium or molybdenum, but it should be understood that any appropriate conductive material can be selected. For example, alternative materials for the etch stop layer 108 can include alloys of iridium with platinum, palladium, osmium, rhodium, or molybdenum. In some embodiments, the etch stop layer 108 can be formed to a thickness between about 1 nm and about 35 nm. The etch stop layer can be formed by any appropriate deposition process, for example including ALD, CVD, PVD, GCIB deposition, and electroplating.

An upper conductive layer 110 is formed over the etch stop layer 108. The upper conductive layer 110 can be formed from the same material as the lower conductive layer 106, or can be formed from a different material and can have an exemplary thickness between about 5 nm and about 200 nm. The material of the upper conductive layer 110 should be selectively etchable with respect to the etch stop layer 108, such that the upper conductive layer 110 can be etched without damaging the lower conductive layer 106. As used herein, the term "selective" in reference to a material removal process denotes that the rate of material removal for a first material is greater than the rate of removal for at least another material of the structure to which the material removal process is being applied.

A hardmask layer 112 is formed over the upper conductive layer 110. The hardmask layer 112 can be formed using any appropriate hardmask material, such as silicon nitride, and can be formed using any appropriate deposition process. A via mask 114 is formed over the hardmask layer 112, using any appropriate deposition process and patterning process. For example, photolithography can be used to form the via mask 114. In other embodiments, sidewall image transfer or other processes can be used to form the via mask.

Figure 2:
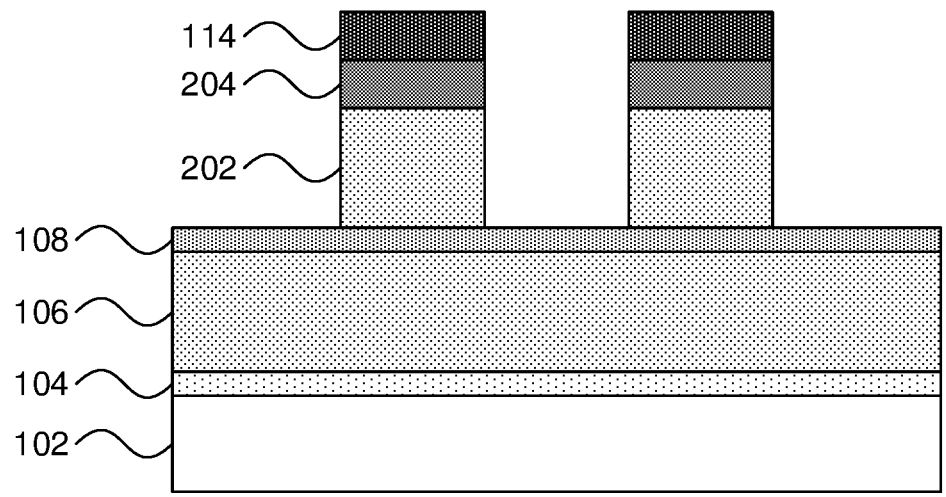
FIG. 2 is a cross-sectional view of a step in the fabrication of vias on a conductive line with an encapsulating layer that shows etching vias from an upper conductive layer in accordance with an embodiment of the present invention.

Referring now to FIG. 2, a cross-sectional view of a step in the fabrication of conductive lines and vias in an integrated chip is shown. The via mask 114 is used to etch down into the hardmask layer 112 and the upper conductive layer 110 to form upper vias 202 and upper via hardmasks 204. Any appropriately selective anisotropic etch can be used to etch down these layers and to stop at the etch stop layer 106. An example of an anisotropic etch is a reactive ion etch (RIE), which is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 3:
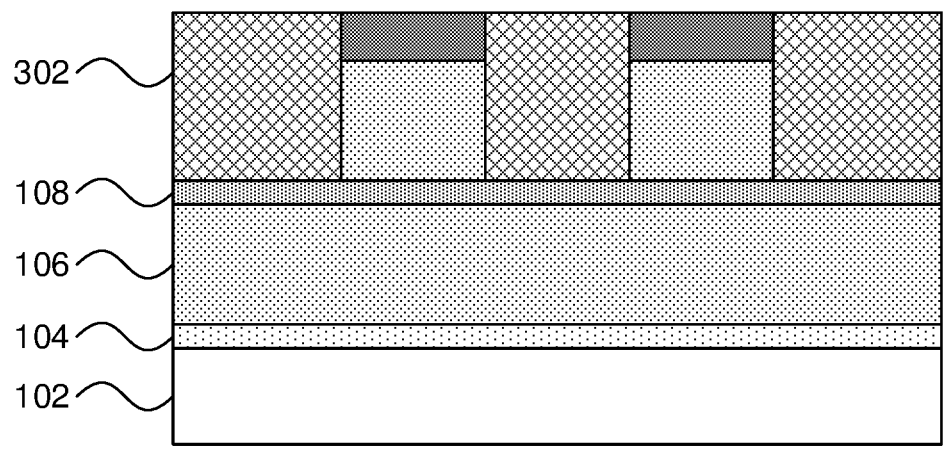
FIG. 3 is a cross-sectional view of a step in the fabrication of vias on a conductive line with an encapsulating layer that shows forming a sacrificial layer around the vias in accordance with an embodiment of the present invention.

Referring now to FIG. 3, a cross-sectional view of a step in the fabrication of conductive lines and vias in an integrated chip is shown. A sacrificial dielectric layer 302 is deposited around the upper vias 202 and the upper via hardmasks 204. Any appropriate deposition process can be used to deposit a sacrificial dielectric material, such as a CVD or spin-on deposition, and any appropriate material can be used that has selectivity with respect to the etch stop layer 106, the upper vias 202, and the upper via hardmasks 204. In some embodiments, silicon dioxide or amorphous silicon can be used as a material for the sacrificial dielectric material. After deposition, the sacrificial dielectric material can be polished down to the height of the top surface of the upper via hardmasks 204 using, e.g., a chemical mechanical planarization (CMP) process. CMP is performed using, e.g., a chemical or granular slurry and mechanical force to gradually remove upper layers of the device. The slurry may be formulated to be unable to dissolve, for example, the upper via hardmasks, resulting in the CMP process's inability to proceed any farther than that layer. Top via masks 114 can be etched away in a separate step or can be removed during the CMP process.

Figure 4:
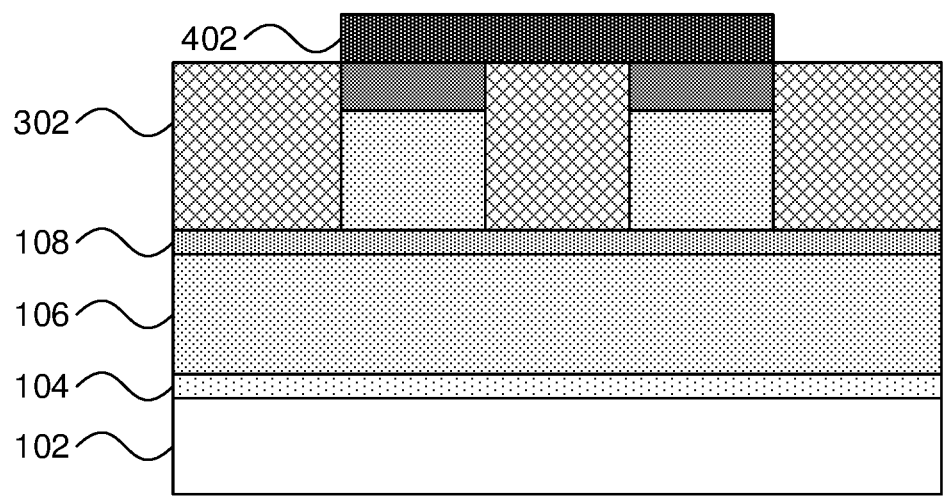
FIG. 4 is a cross-sectional view of a step in the fabrication of vias on a conductive line with an encapsulating layer that shows patterning a mask for a lower conductive line in accordance with an embodiment of the present invention.

Referring now to FIG. 4, a cross-sectional view of a step in the fabrication of conductive lines and vias in an integrated chip is shown. A lower line mask 402 is formed over the sacrificial dielectric layer 302 and the upper via hardmasks 204. The lower line mask 402 establishes a pattern for lower conductive lines to be formed and can be patterned using any appropriate process, such as photolithography.

Figure 5:
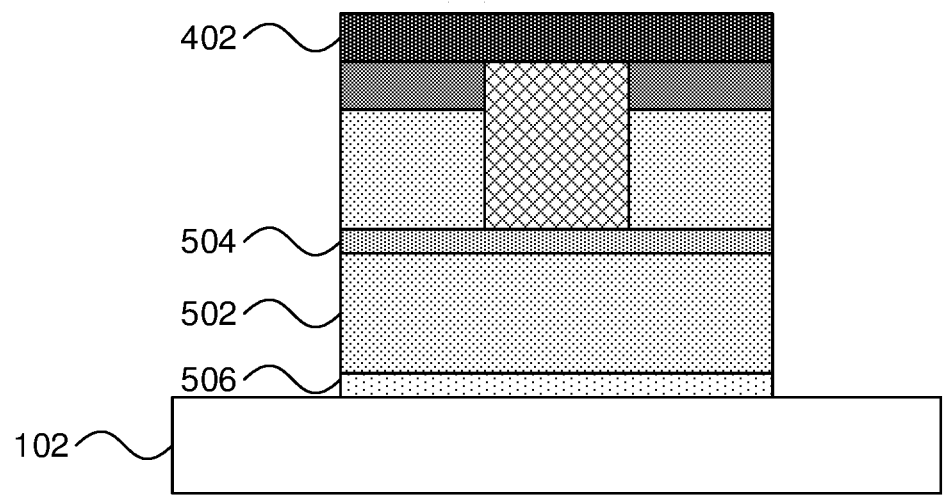
FIG. 5 is a cross-sectional view of a step in the fabrication of vias on a conductive line with an encapsulating layer that shows etching the lower conductive line in accordance with an embodiment of the present invention.

Referring now to FIG. 5, a cross-sectional view of a step in the fabrication of conductive lines and vias in an integrated chip is shown. The lower line mask 402 is used to etch away exposed portions of the sacrificial dielectric layer 302 and to etch down into the etch stop layer 108 and the lower conductive layer 106 to form lower vias 502 and etch stop remainder 504. Any appropriately selective anisotropic etch or etches can be used to etch down these layers and to stop at the underlying layer 102. It is specifically contemplated that this can be accomplished in four separate selective anisotropic etches, including RIE of the sacrificial layer 302, an ion beam etch (IBE) of the etch stop layer 108, an RIE of the lower conductive layer 106 down to the seed layer 104, and an RIE of the seed layer 104 that stops on the underlying layer 102, leaving seed layer remnant 506. However, depending on the materials and available etch processes, some or all of these etching steps can be combined into a single etching process.

Figure 6:
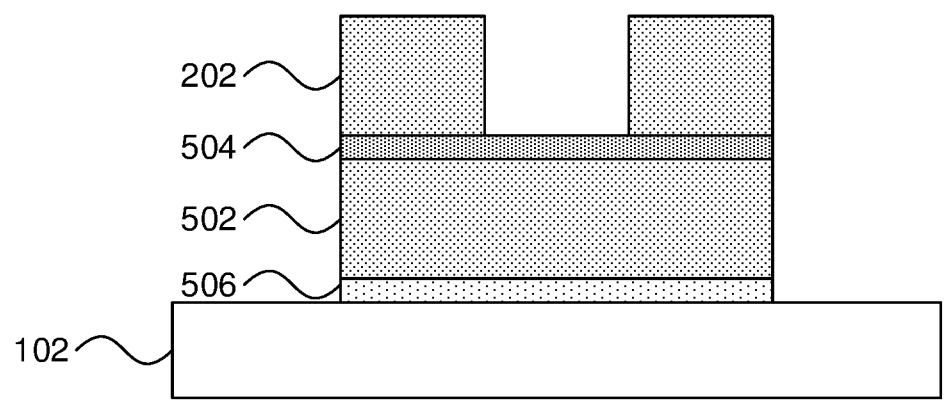
FIG. 6 is a cross-sectional view of a step in the fabrication of vias on a conductive line with an encapsulating layer that shows etching away the sacrificial layer in accordance with an embodiment of the present invention.

Referring now to FIG. 6, a cross-sectional view of a step in the fabrication of conductive lines and vias in an integrated chip is shown. The lower line mask 402, the upper via hardmasks 204, and the remaining sacrificial dielectric material 302 is etched away in one or more selective etches that preserve the conductive material of the upper vias 202, the etch stop layer 504, the lower lines 502, and the seed layer remnant 506.

Figure 7:
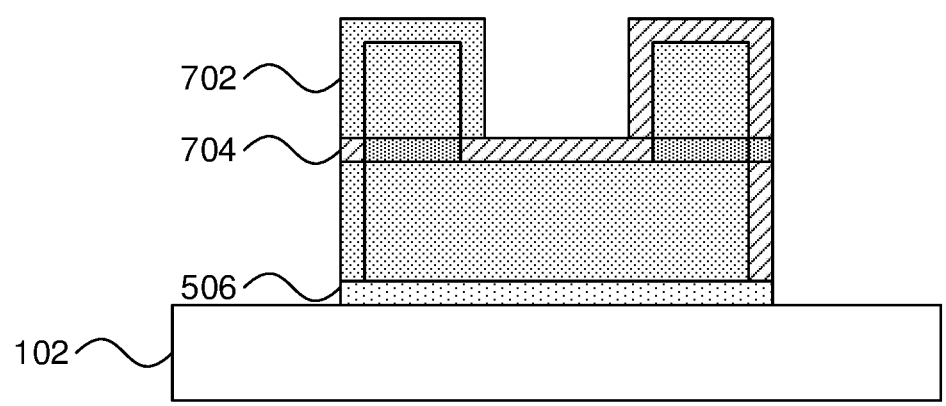
FIG. 7 is a cross-sectional view of a step in the fabrication of vias on a conductive line with an encapsulating layer that shows the formation of an encapsulating layer in accordance with an embodiment of the present invention.

Referring now to FIG. 7, a cross-sectional view of a step in the fabrication of conductive lines and vias in an integrated chip is shown. An encapsulation layer 702 is formed on the exposed surfaces of the upper vias 202 and the lower lines 502 by, e.g., oxidizing or nitridizing the exposed surfaces. A similar encapsulation layer 704 is formed on the exposed surfaces of the etch stop remainder 504. In examples where the conductive upper vias 202 and lower lines 502 are formed from ruthenium and where the etch stop remainder 504 is formed from iridium, the first encapsulation layer 702 can thus be formed from a ruthenium oxide or ruthenium nitride and the second encapsulation layer 704 can be formed from iridium oxide or iridium nitride. In some embodiments, silicon species can be introduced during the oxidation or nitridation process to form a first encapsulation layer 702 of silicon-doped ruthenium oxide or silicon-doped ruthenium nitride and a second encapsulation layer 704 of silicon-doped iridium oxide or silicon-doped iridium nitride. It should be understood that these specific materials for the encapsulation layers are described solely for one particular embodiment, and that other materials will result from the oxidation or nitridation process if the conductive layers and etch stop layers are formed from alternative materials, as described above.

In embodiments that perform an oxidation, appropriate oxidation processes include, for example, ultraviolet ozone treatment and oxygen/ozone plasma treatment. In embodiments that perform a nitridation, appropriate nitridation processes include, for example, ultraviolet nitrogen/ammonia treatment and nitrogen/ammonia plasma treatment. In some embodiments, the oxidation or nitridation process can be performed at a temperature between about 20° C. and about 300° C., although lower and higher temperatures are also contemplated. Additionally, silane or disilane gas can be included in the oxidation or nitridation process to create a silicon-doped encapsulation layer.

Figure 8:
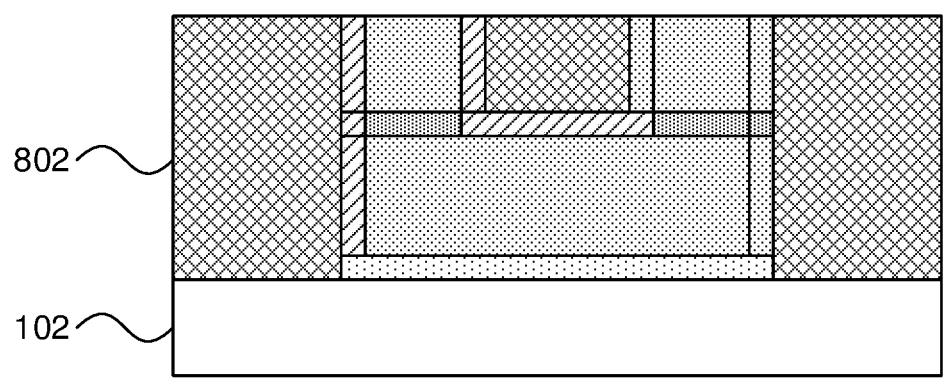
FIG. 8 is a cross-sectional view of a step in the fabrication of vias on a conductive line with an encapsulating layer that shows the formation of an interlayer dielectric in accordance with an embodiment of the present invention.

Referring now to FIG. 8, a cross-sectional view of a step in the fabrication of conductive lines and vias in an integrated chip is shown. A dielectric material is deposited around the upper vias 202 and lower lines 502. The dielectric material can be deposited by any appropriate deposition process and can be formed from any suitable dielectric material, for example including silicon dioxide or a low-k dielectric material. Excess dielectric material can be polished away to form interlayer dielectric 802, using a CMP process that stops on the conductive material of the upper vias 202. The top portion of the encapsulating layer 702 can also be polished away, exposing the top conductive surface of the upper vias 202. At this stage, additional layers and structures can be formed over the upper vias 202 in electrical communication with the upper vias 202.

Figure 9:
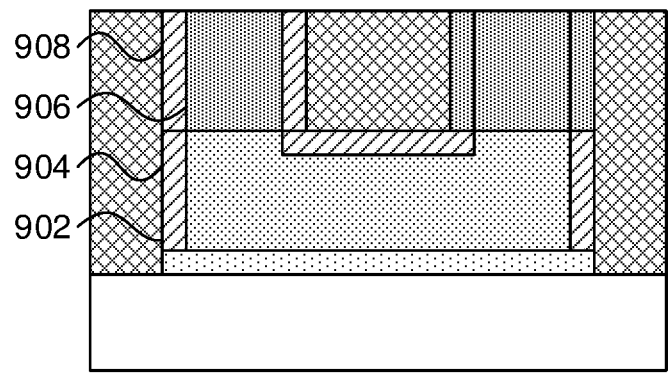
FIG. 9 is a cross-sectional view of a step in the fabrication of an alternative embodiment of vias on a conductive line with an encapsulating layer that shows the formation of vias on a conductive line without an interposed etch stop layer in accordance with an embodiment of the present invention.

Referring now to FIG. 9, a cross-sectional view of a step in an alternative embodiment of the fabrication of conductive lines and vias in an integrated chip is shown. Instead of forming upper vias and lower lines from a same conductive material, using an etch stop layer of a different material, other embodiments form lower lines 902 from a first conductive material and lower lines 906 from a second conductive material. In such embodiments, the etch that forms the vias stops on the material of the lower conductive layer. The formation of the encapsulation layer produces lower encapsulation layer 904 and upper encapsulation layer 908 as an oxide or nitride of the respective conductive material.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative teams are intended to encompass different orientations of the device in use or operation in addition to the orientation depicted in the FIGS. For example, if the device in the FIGS. is turned over, elements described as "below" "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 10:
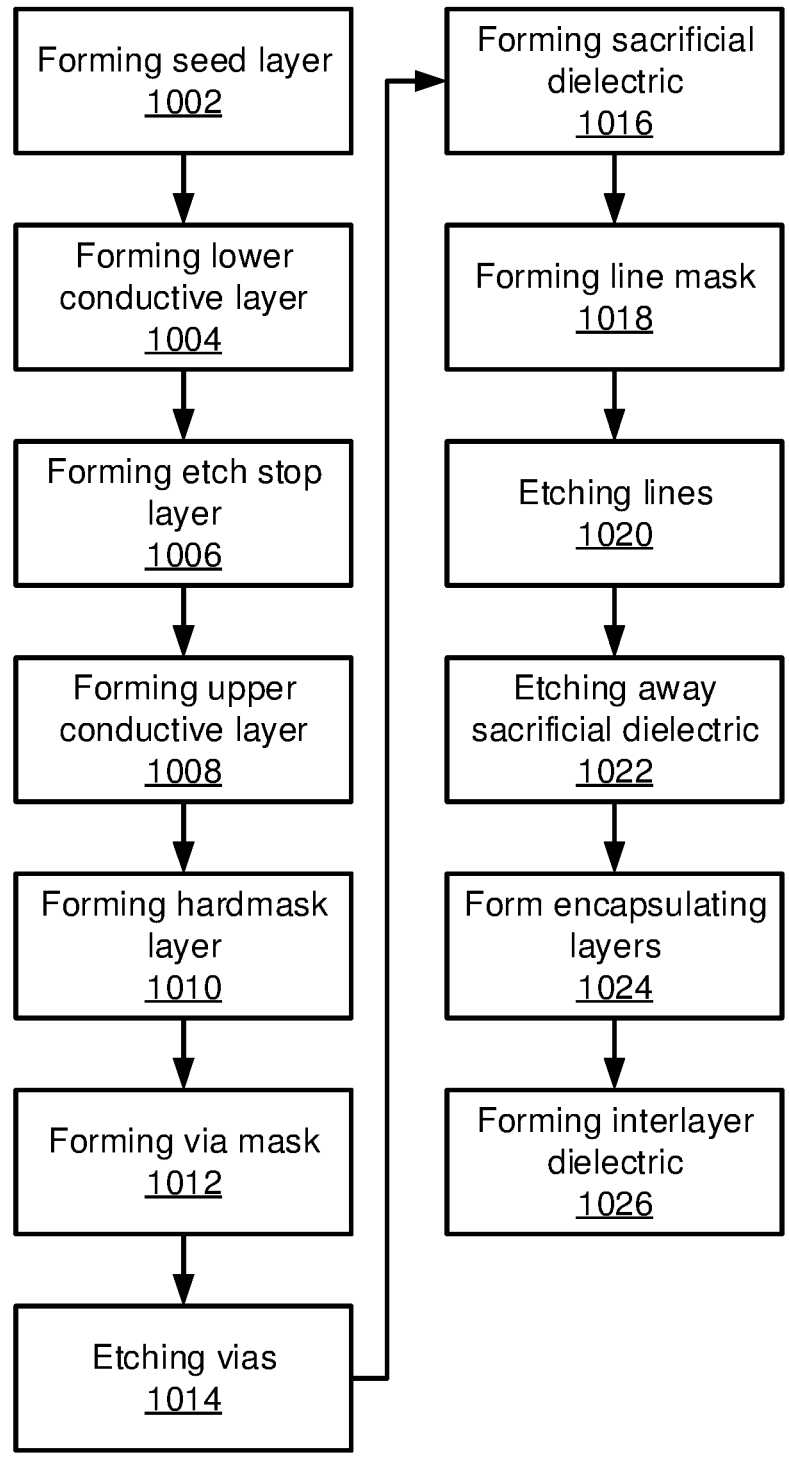
FIG. 10 is a block/flow diagram of a method for fabricating a conductive via on a conductive line using an etch stop layer in accordance with an embodiment of the present invention.

Referring now to FIG. 10, a block/flow diagram of a method of fabricating conductive lines and vias in an integrated chip is shown. Block 1002 forms a seed layer 104 on an underlying layer 102 using any appropriate deposition process. Block 1004 forms the lower conductive layer 106 on the seed layer 104, with the seed layer 104 providing nucleation for the deposition process. Block 1006 forms an etch stop layer 108 on the lower conductive layer from a conductive material distinct from the material of the lower conductive layer 106. Block 1008 forms the upper conductive layer 110 on the etch stop layer from a conductive material that is selectively with respect to the material of the etch stop layer 108. Block 1010 forms a hardmask layer 112 on the upper conductive layer 110 and block 1012 forms a via mask on the hardmask layer 112 using any appropriate patterning process.

Block 1014 uses one or more selective anisotropic etches to form the upper vias 202, with the etch(es) stopping on the etch stop layer 108. Block 1016 forms sacrificial dielectric layer 302 by depositing the dielectric material and polishing down to the level of hardmasks 204 using a CMP process. Block 1018 forms line mask 402 using any appropriate patterning process and block 1020 etches down using one or more selective anisotropic etches to form the lower lines 502.

Block 1022 etches away remaining parts of the sacrificial dielectric layer 302 to expose the vias 202. Block 1024 then forms encapsulating layers 702 and 704 on the exposed surfaces of the upper vias 202, the lower conductive layers 502, and the etch stop layer 504. Block 1026 forms an interlayer dielectric 802 around the vias 202 and the lines 502, including a CMP that polishes down to remove the topmost portion of encapsulating layer 702 to expose the top surface of the upper vias 202.

Figure 11:
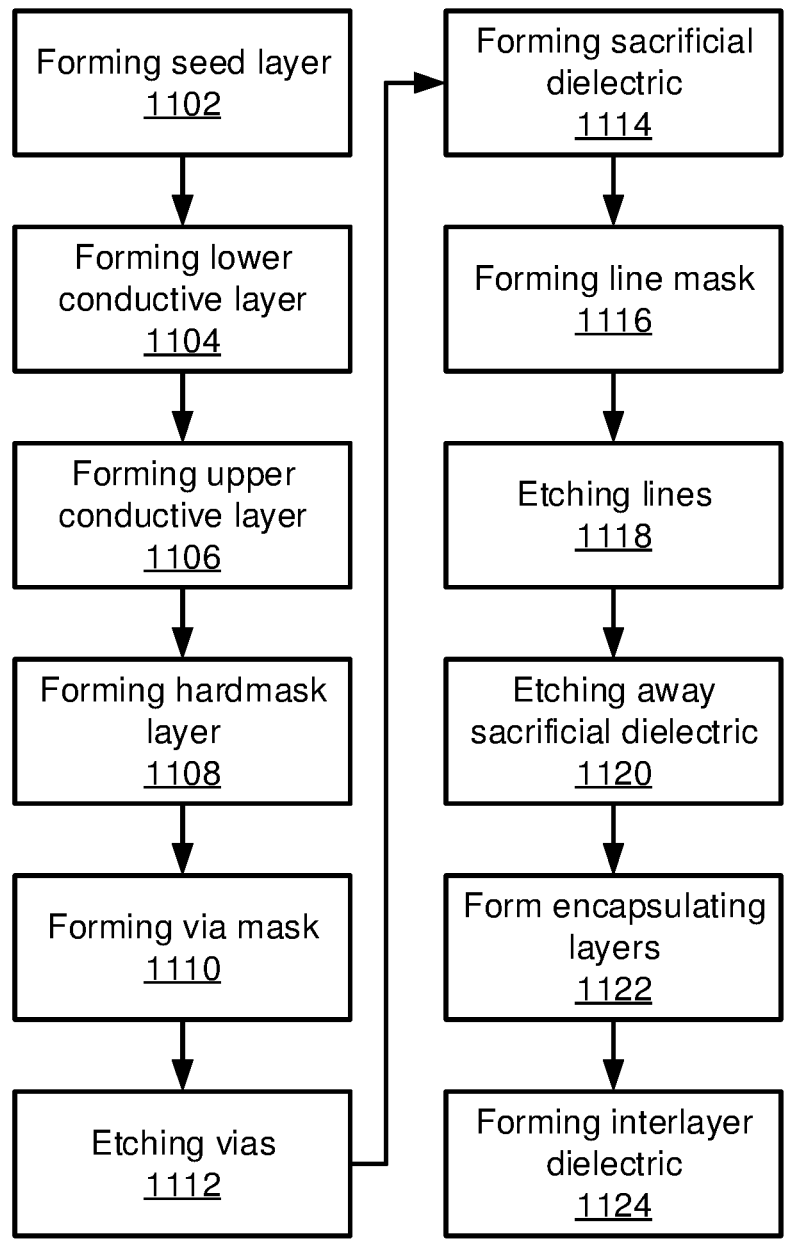
FIG. 11 is a block/flow diagram of a method for fabricating a conductive via on a conductive line without using an etch stop layer in accordance with an embodiment of the present invention.

Referring now to FIG. 11, a block/flow diagram of a method of fabricating conductive lines and vias in an integrated chip is shown. Block 1102 forms a seed layer on an underlying layer using any appropriate deposition process. Block 1104 forms the lower conductive layer on the seed layer, with the seed layer providing nucleation for the deposition process.

In this embodiment, block 1106 forms an upper conductive layer directly on the lower conductive layer, without any etch stop layer in between. The upper conductive layer is formed from a conductive material that is distinct from the material of the lower conductive layer. Block 1108 forms a hardmask layer on the upper conductive layer and block 1110 forms a via mask on the hardmask layer using any appropriate patterning process.

Block 1112 uses one or more selective anisotropic etches to form the upper vias 906, with the etch(es) stopping on the lower conductive layer. Block 1114 forms a sacrificial dielectric layer by depositing the dielectric material and polishing down to the level of hardmasks using a CMP process. Block 1116 forms line mask using any appropriate patterning process and block 1118 etches down using one or more selective anisotropic etches to form the lower lines 902.

Block 1120 etches away remaining parts of the sacrificial dielectric layer to expose the vias 906. Block 1122 then forms encapsulating layers 904 and 908 on the exposed surfaces of the upper vias 906 and the lower conductive lines 902. Block 1126 forms an interlayer dielectric around the vias 906 and the lines 902, including a CMP that polishes down to remove the topmost portion of encapsulating layer 908 to expose the top surface of the upper vias 906.

Having described preferred embodiments of encapsulated top via contacts (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
   a lower conductive line;
   an etch stop layer, including a first conductive material, on the lower conductive line;
   an upper conductive via, including a second conductive material that is different from the first conductive material and that is selectively etchable with respect to the first conductive material, over the etch stop layer;
   an encapsulation layer directly on outer surfaces of the upper conductive via and the lower conductive line that includes an oxidized or nitridized portion of the first conductive material and the second conductive material with a silicon dopant; and
   an interlayer dielectric around the encapsulation layer, wherein the encapsulation layer promotes adhesion between the lower conductive line, the upper conductive via, and the interlayer dielectric.

2. The semiconductor device of claim 1, wherein the first conductive material is selected from the group consisting of ruthenium and iridium and wherein the second conductive material is selected from the group consisting of ruthenium and iridium.

3. The semiconductor device of claim 1, wherein the encapsulation layer is further formed on an outer surface of the etch stop layer.

4. The semiconductor device of claim 1, wherein the lower conductive line includes the first conductive material.

5. The semiconductor device of claim 4, wherein the etch stop layer is a top surface of the lower conductive line.

6. The semiconductor device of claim 1, further comprising a seed layer remnant between the lower conductive line and an underlying substrate.

7. A semiconductor device, comprising:
   a lower conductive line, including a first conductive material;
   an upper conductive via, including a second conductive material, different from the first conductive material, that is selectively etchable with respect to the first conductive material, over the lower conductive line;
   an encapsulation layer including a first portion directly on outer surfaces of the upper conductive via and a second portion directly on outer surfaces of the lower conductive line;
   an interlayer dielectric around the encapsulation layer, wherein the encapsulation layer promotes adhesion between the lower conductive line, the upper conductive via, and the interlayer dielectric.

8. The semiconductor device of claim 7, wherein the first conductive material is selected from the group consisting of ruthenium and iridium and wherein the second conductive material is selected from the group consisting of ruthenium and iridium.

9. The semiconductor device of claim 7, wherein the encapsulation layer further includes a second portion directly on outer surfaces of the lower conductive line.

10. The semiconductor device of claim 7, further comprising a seed layer remnant between the lower conductive line and an underlying substrate.

11. The semiconductor device of claim 6, wherein the seed layer is tantalum nitride and the lower conductive line is ruthenium.

12. The semiconductor device of claim 10, wherein the seed layer is tantalum nitride and the lower conductive line is ruthenium.

* * * * *